United States Patent
Pandey et al.

(10) Patent No.: US 11,855,197 B2
(45) Date of Patent: Dec. 26, 2023

(54) VERTICAL BIPOLAR TRANSISTORS

(71) Applicant: GLOBALFOUNDRIES U.S. Inc., Malta, NY (US)

(72) Inventors: Shesh Mani Pandey, Saratoga Springs, NY (US); Alexander M. Derrickson, Saratoga Springs, NY (US); Judson R. Holt, Ballston Lake, NY (US); Vibhor Jain, Williston, VT (US)

(73) Assignee: GLOBALFOUNDRIES U.S. INC., Malta, NY (US)

( * ) Notice: Subject to any disclaimer, the term of this patent is extended or adjusted under 35 U.S.C. 154(b) by 0 days.

(21) Appl. No.: 17/580,127

(22) Filed: Jan. 20, 2022

(65) Prior Publication Data
US 2023/0231041 A1   Jul. 20, 2023

(51) Int. Cl.
| | |
|---|---|
| *H01L 29/737* | (2006.01) |
| *H01L 29/08* | (2006.01) |
| *H01L 29/10* | (2006.01) |
| *H01L 29/417* | (2006.01) |
| *H01L 29/423* | (2006.01) |
| *H01L 29/66* | (2006.01) |

(52) U.S. Cl.
CPC ...... *H01L 29/7371* (2013.01); *H01L 29/0821* (2013.01); *H01L 29/1004* (2013.01); *H01L 29/41708* (2013.01); *H01L 29/42304* (2013.01); *H01L 29/66234* (2013.01)

(58) Field of Classification Search
CPC ............. H01L 29/7371; H01L 29/0821; H01L 29/1004; H01L 29/41708; H01L 29/42304; H01L 29/66234
See application file for complete search history.

(56) References Cited

U.S. PATENT DOCUMENTS

| | | |
|---|---|---|
| 6,232,649 B1 | 5/2001 | Lee |
| 8,441,084 B2 | 5/2013 | Cai et al. |
| 9,437,718 B1 | 9/2016 | Cai et al. |
| 9,502,504 B2 | 11/2016 | Cai et al. |
| 9,748,369 B2 | 8/2017 | Liu |
| 2003/0207512 A1 | 11/2003 | Hsu |
| 2004/0222436 A1 | 11/2004 | Joseph et al. |
| 2008/0164494 A1* | 7/2008 | Pagette ............... H01L 29/0821 257/E29.174 |
| 2008/0308837 A1 | 12/2008 | Gauthier, Jr. et al. |
| 2013/0001647 A1 | 1/2013 | Adler |

(Continued)

OTHER PUBLICATIONS

EP Search Report in EP Application No. 222007139.0-1212 dated May 23, 2023, 12 pages.

(Continued)

*Primary Examiner* — Syed I Gheyas
(74) *Attorney, Agent, or Firm* — Francois Pagette; Andrew M. Calderon; Calderon Safran & Cole P.C.

(57) ABSTRACT

The present disclosure relates to semiconductor structures and, more particularly, to vertical bipolar transistors and methods of manufacture. The structure includes: an intrinsic base region comprising semiconductor-on-insulator material; a collector region confined within an insulator layer beneath the semiconductor-on-insulator material; an emitter region above the intrinsic base region; and an extrinsic base region above the intrinsic base region.

18 Claims, 10 Drawing Sheets

(56) References Cited

U.S. PATENT DOCUMENTS

| | | |
|---|---|---|
| 2013/0119434 A1* | 5/2013 | Adkisson .............. H01L 29/732 |
| | | 257/E29.174 |
| 2015/0140771 A1 | 5/2015 | Fox et al. |
| 2015/0270335 A1 | 9/2015 | Sadovnikov et al. |
| 2021/0091180 A1 | 3/2021 | Pekarik et al. |
| 2021/0091213 A1 | 3/2021 | Jain et al. |

OTHER PUBLICATIONS

Koričić et al., "Double-Emitter Reduced-Surface-Field Horizontal Current Bipolar Transistor With 36 V Breakdown Integrated in BiCMOS at Zero Costar", IEEE Electron Device Letters, vol. 36, No. 2, Feb. 2015, 3 pages.

Suligoj et al., "Horizontal Current Bipolar Transistor With a Single Polysilicon Region for Improved High-Frequency Performance of BiCMOS ICs", IEEE Electron Device Letters, vol. 31, No. 6, Jun. 2010, 3 pages.

Search Report in related EP Application No. 22199933-1212 dated Jun. 26, 2023, 10 pages.

Office Action in related U.S. Appl. No. 17/740,725 dated Jun. 15, 2023, 14 pages.

Response to Office Action in related U.S. Appl. No. 17/740,725, filed Aug. 25, 2023, 8 pages.

* cited by examiner

US 11,855,197 B2

VERTICAL BIPOLAR TRANSISTORS

FIELD OF THE INVENTION

The present disclosure relates to semiconductor structures and, more particularly, to vertical bipolar transistors and methods of manufacture.

Bipolar transistors can be vertical transistors or lateral transistors. In a vertical bipolar transistor, carriers flow in a vertical direction. Vertical silicon bipolar junction transistor (BJT) and SiGe heterojunction bipolar transistor (HBT) technologies are preferred for high performance applications like mm-wave power amplifiers and low noise amplifiers, automotive radars and optical interconnects. These devices can attain very high fT (current gain cut-off frequency) and high fmax (power gain cut off frequency) values compared to CMOS. Typically, these devices are formed in the bulk substrate or in a cavity touching the handle wafer for a semiconductor-on-insulator (SOI) substrate, which raises cost and process complexity. It also creates problems of adjacent device isolation and leakage which requires additional processing steps. In certain applications it is preferable to have the vertical bipolar transistors formed on the SOI region to reduce cost while achieving the desired performance.

SUMMARY

In an aspect of the disclosure, a structure comprises: an intrinsic base region comprising semiconductor-on-insulator material; a collector region confined within an insulator layer beneath the semiconductor-on-insulator material; an emitter region above the intrinsic base region; and an extrinsic base region above the intrinsic base region.

In an aspect of the disclosure, a structure comprises: an intrinsic base region comprising doped semiconductor material; an emitter region extending vertically upward from the intrinsic base region; an extrinsic base region extending vertically upward from the intrinsic base region; a collector contact extending vertically upward from the intrinsic base region; and a collector region within a cavity in insulator material beneath the doped semiconductor material and contacting the intrinsic base region and the collector contact.

In an aspect of the disclosure, a method comprises: forming an intrinsic base region comprising semiconductor-on-insulator material; forming a collector region confined within an insulator layer beneath the semiconductor-on-insulator material; forming an emitter region above the intrinsic base region; and forming an extrinsic base region above the intrinsic base region.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to vertical bipolar transistors and methods of manufacture. More specifically, the present disclosure relates to vertical bipolar transistors with a collector region confined within a buried insulator region of the substrate. Advantageously, the vertical bipolar transistors exhibit reduced base to collector capacitance (Cbc), while also allowing for a tunable base width (Wb). The vertical bipolar transistors also significantly reduce process complexity by eliminating many masking steps and implant/anneal processes compared to known fabrication processes.

In more specific embodiments, the vertical bipolar junction transistor comprises a collector region inside a buried oxide layer in semiconductor-on-insulator technology. In further embodiments, the vertical bipolar junction transistor comprises an extrinsic base vertically contacting a lightly doped intrinsic base. The vertical bipolar junction transistor further comprises spacers laterally isolating the extrinsic base from the emitter/collector region, with the intrinsic base region both vertically and laterally contacting the collector region. The collector region extends deeper into the buried oxide layer compared to the base region or emitter region. An airgap may be underneath the collector region, between the collector region and the buried oxide region. The collector region preferably does not overlap with a base contact.

The vertical bipolar transistors of the present disclosure can be manufactured in a number of ways using a number of different tools. In general, though, the methodologies and tools are used to form structures with dimensions in the micrometer and nanometer scale. The methodologies, i.e., technologies, employed to manufacture the vertical bipolar transistors of the present disclosure have been adopted from integrated circuit (IC) technology. For example, the structures are built on wafers and are realized in films of material patterned by photolithographic processes on the top of a wafer. In particular, the fabrication of the vertical bipolar transistors uses three basic building blocks: (i) deposition of thin films of material on a substrate, (ii) applying a patterned mask on top of the films by photolithographic imaging, and (iii) etching the films selectively to the mask.

Figure 1:
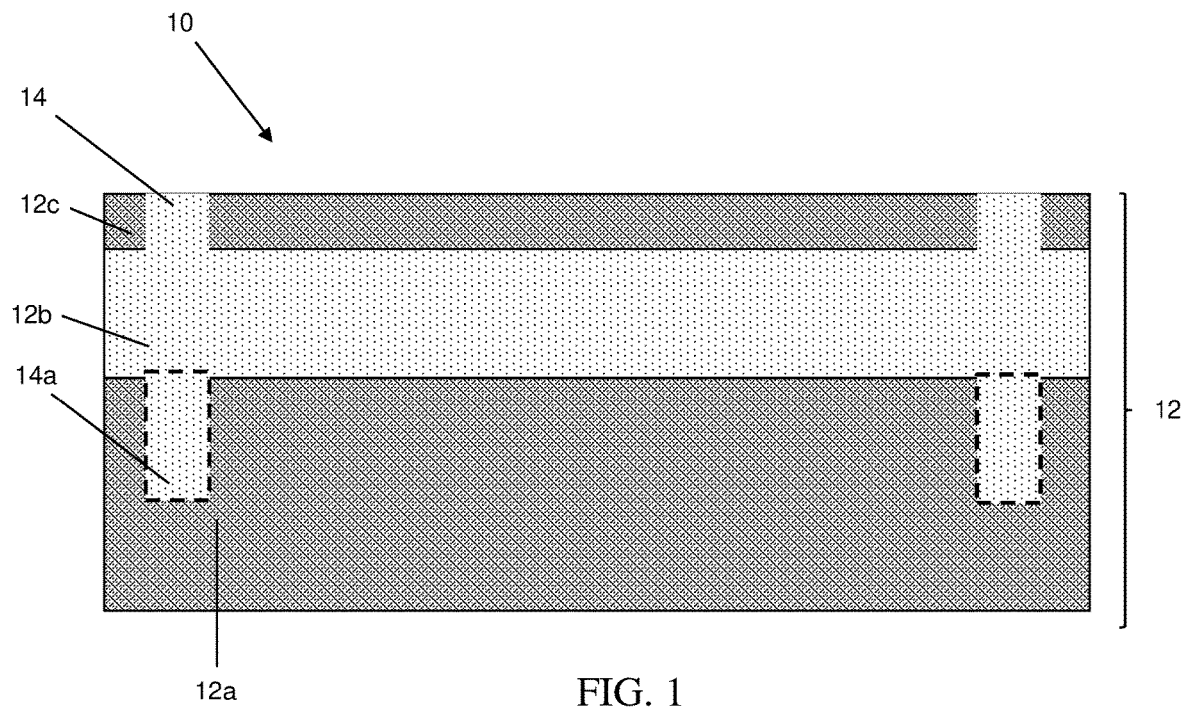
FIG. 1 shows a starting substrate, amongst other features, and respective fabrication processes in accordance with aspects of the present disclosure.

FIG. 1 shows a starting substrate, amongst other features, and respective fabrication processes in accordance with aspects of the present disclosure. In particular, the structure 10 of FIG. 1 includes a substrate 12 which may be a semiconductor-on-insulator (SOI) substrate. More specifically, the substrate 12 includes a semiconductor handle wafer 12a, an insulator layer 12b and a semiconductor layer 12c on the insulator layer 12b. In the SOI implementation, the semiconductor handle wafer 12a provides mechanical support to the insulator layer 12b and the semiconductor layer 12c. The semiconductor handle wafer 12a and the semiconductor layer 12c may be composed of any suitable semiconductor material including, but not limited to, Si, SiGe, SiGeC, SiC, GaAs, InAs, InP, and other III/V or II/VI compound semiconductors. In preferred embodiments, the semiconductor handle wafer 12a and semiconductor layer 12c may be a p-doped substrate.

In embodiments, the semiconductor layer 12c may be Si or SiGe material for use as an intrinsic base region of a vertical bipolar transistor. The semiconductor layer 12c may be tuned to different base widths (e.g., thicknesses). For example, the semiconductor layer 12c may be thinned by an over-etch process or, alternatively, thickened by an epitaxial growth process. In embodiments, the base width (e.g., thickness) of the semiconductor layer 12c may be from about 2 nm to 200 nm; although other dimensions are contemplated herein depending on the desired application and device performance characteristics. For a NPN vertical bipolar, the semiconductor layer 12c can be doped with a p-type material like boron (B) and may also contain a carbon (C) layer to reduce boron out-diffusion during subsequent processing.

The insulator layer 12b may include a dielectric material such as silicon dioxide, silicon nitride, silicon oxynitride, boron nitride or a combination thereof. In a preferred embodiment, the insulator layer 12b may be a buried oxide layer (BOX). The insulator layer 12b may be formed by a deposition process, such as CVD, PECVD or physical vapor deposition (PVD). In another embodiment, the insulator layer 12b may be formed using a thermal growth process, such as thermal oxidation, to convert a surface portion of the semiconductor handle wafer 12a to an oxide material. In yet another embodiment, the insulator layer 12b may be formed by implanting oxygen atoms into a bulk semiconductor substrate and thereafter annealing the structure.

Still referring to FIG. 1, shallow trench isolation structures 14 may be formed in the substrate 12. In embodiments, the shallow trench isolation structures 14 may be formed using conventional lithography, etching and deposition methods known to those of skill in the art. For example, a resist formed over the semiconductor layer 12c is exposed to energy (light) to form a pattern (opening). An etching process with a selective chemistry, e.g., reactive ion etching (RIE), may be used to transfer the pattern from the resist to the semiconductor layer 12c to form one or more trenches in the semiconductor layer 12c. In embodiments, the trenches may extend to the semiconductor handle wafer 12a as shown by optional region 14a in dashed lines of FIG. 1. Following the resist removal by a conventional oxygen ashing process or other known stripants, insulator material, e.g., $SiO_2$, can be deposited within the trenches by any conventional deposition processes, e.g., chemical vapor deposition (CVD) processes. Any residual material on the surface of the semiconductor layer 12c can be removed by conventional chemical mechanical polishing (CMP) processes.

Figure 2:
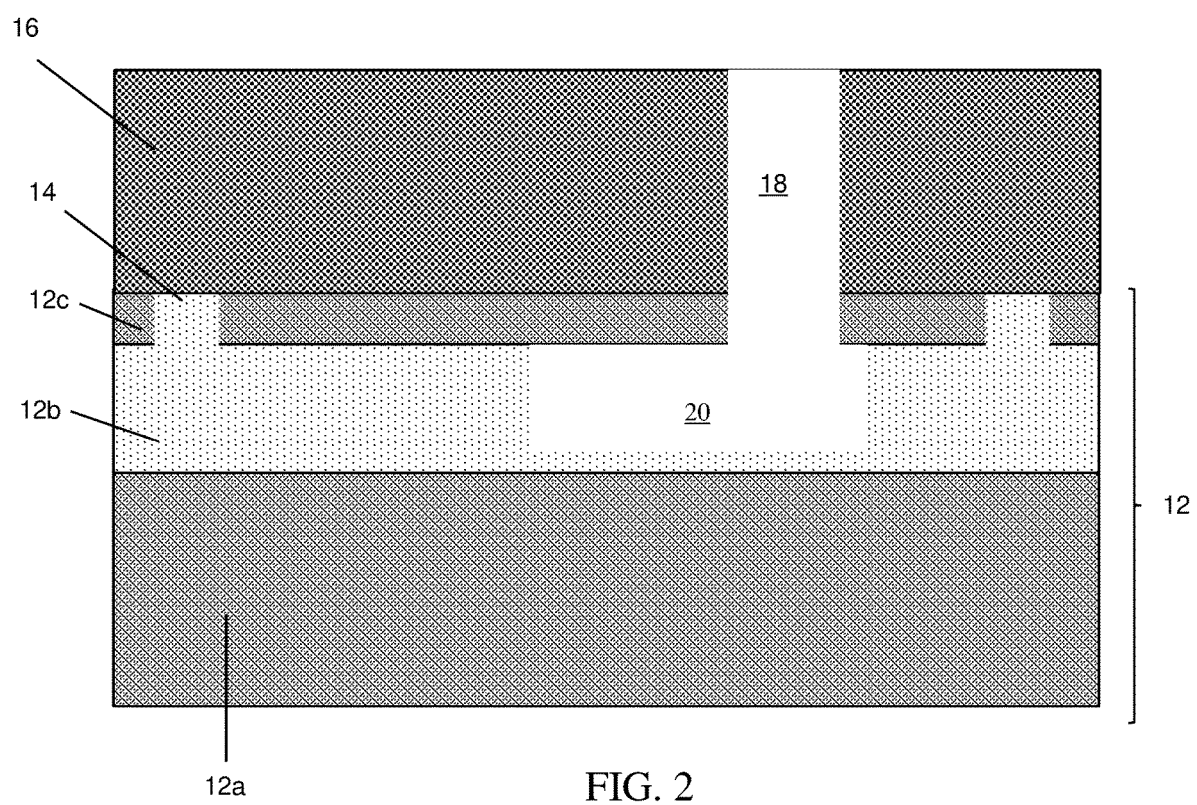
FIG. 2 shows a masking material over the substrate, and respective fabrication processes in accordance with aspects of the present disclosure.

In FIG. 2, a masking material 16 may be formed over the substrate 12 and, more specifically, the semiconductor layer 12c. In embodiments, the masking material 16 may be an insulator material and, more specifically, may be a nitride material deposited by a conventional CVD process. A trench 18 may be formed in the masking material 16 and semiconductor layer 12c, exposing the insulator material 12b. A cavity 20 may be formed in the insulator layer 12b. In embodiments, the cavity 20 may extend partially within the insulator layer 12b or, alternatively, fully through the insulator layer 12b to expose the underlying semiconductor handle wafer 12a. In either scenario, the trench 18 and cavity 20 may be formed using conventional lithography and etching processes, with selective etch chemistries for the trench 18 and the cavity 20, as is known in the art such that no further explanation is required for one of ordinary skill in the art to have a complete understanding of the present disclosure.

Figure 3A:
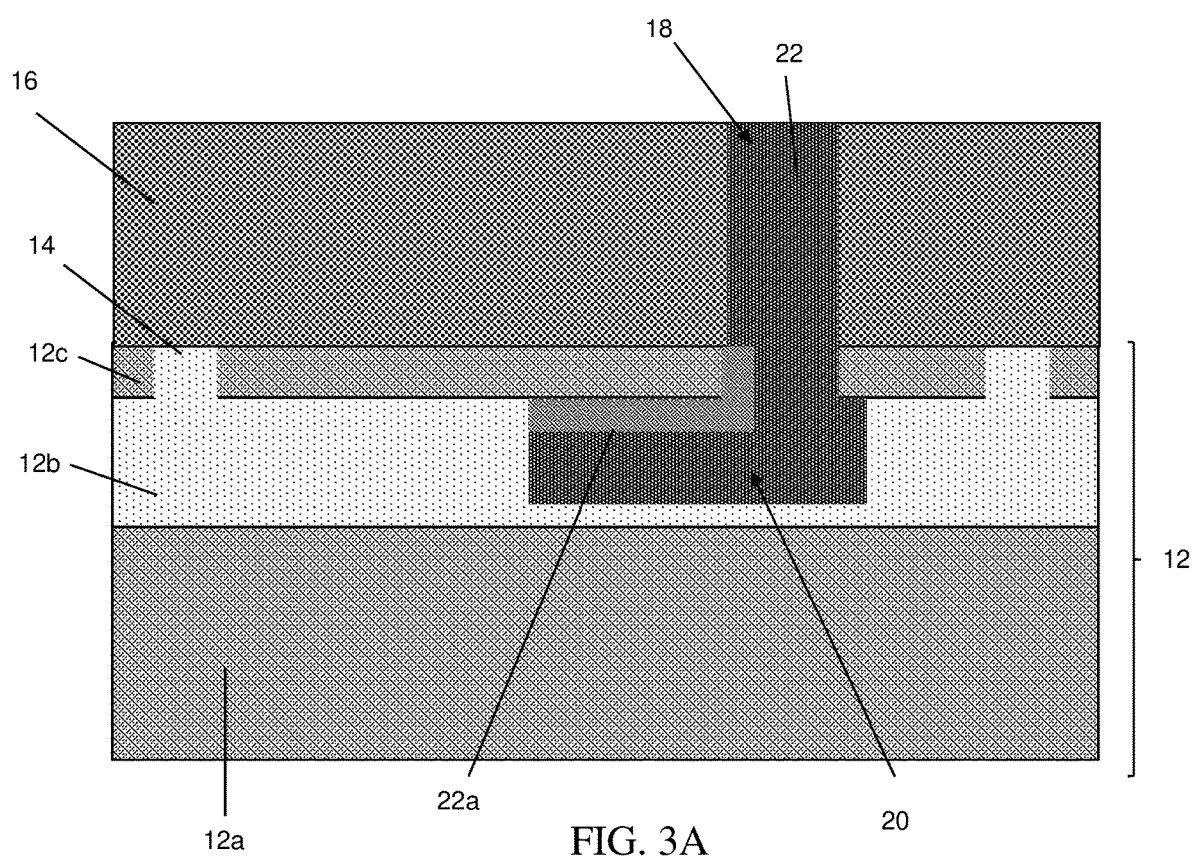
FIG. 3A shows semiconductor material completely filling a cavity in a buried insulator layer, and respective fabrication processes in accordance with aspects of the present disclosure.
Figure 3B:
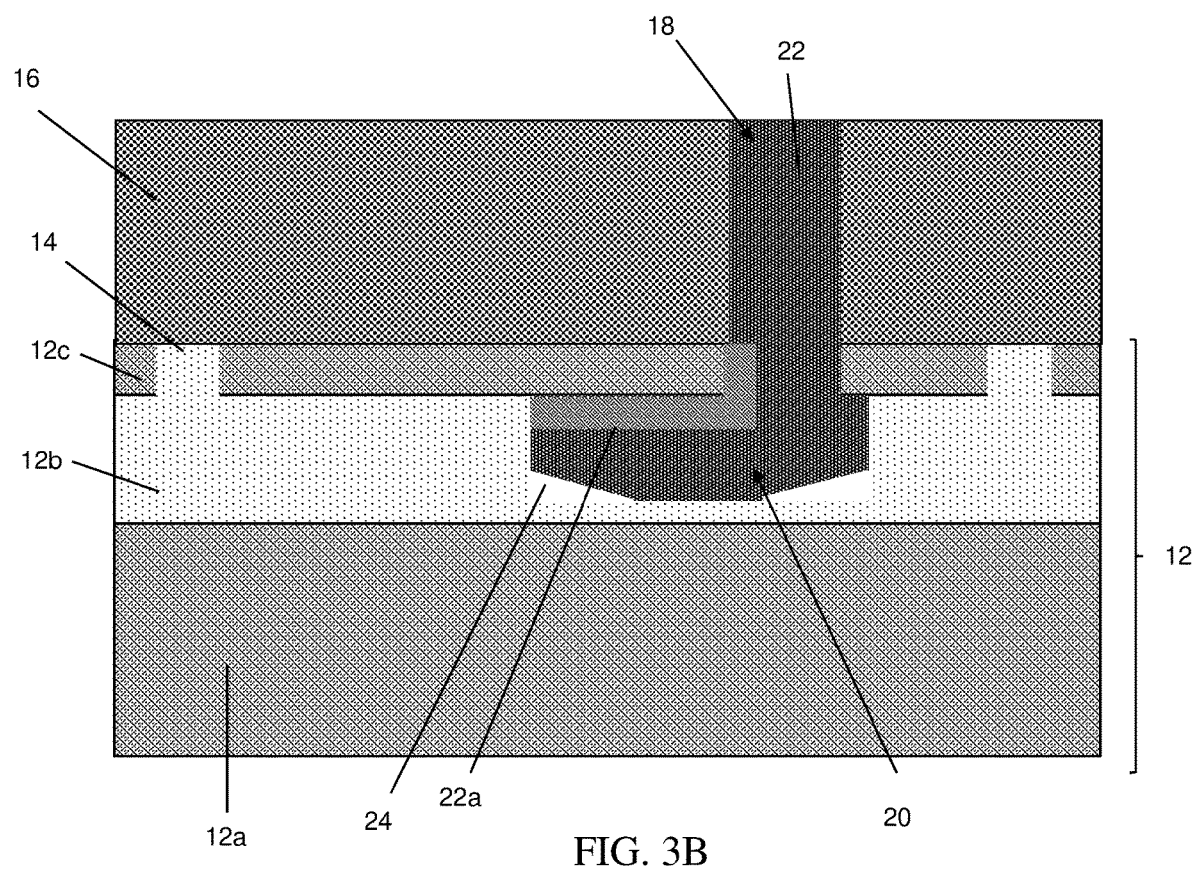
FIG. 3B shows semiconductor material partially filling the cavity in the buried insulator layer, and respective fabrication processes in accordance with aspects of the present disclosure.
Figure 5:
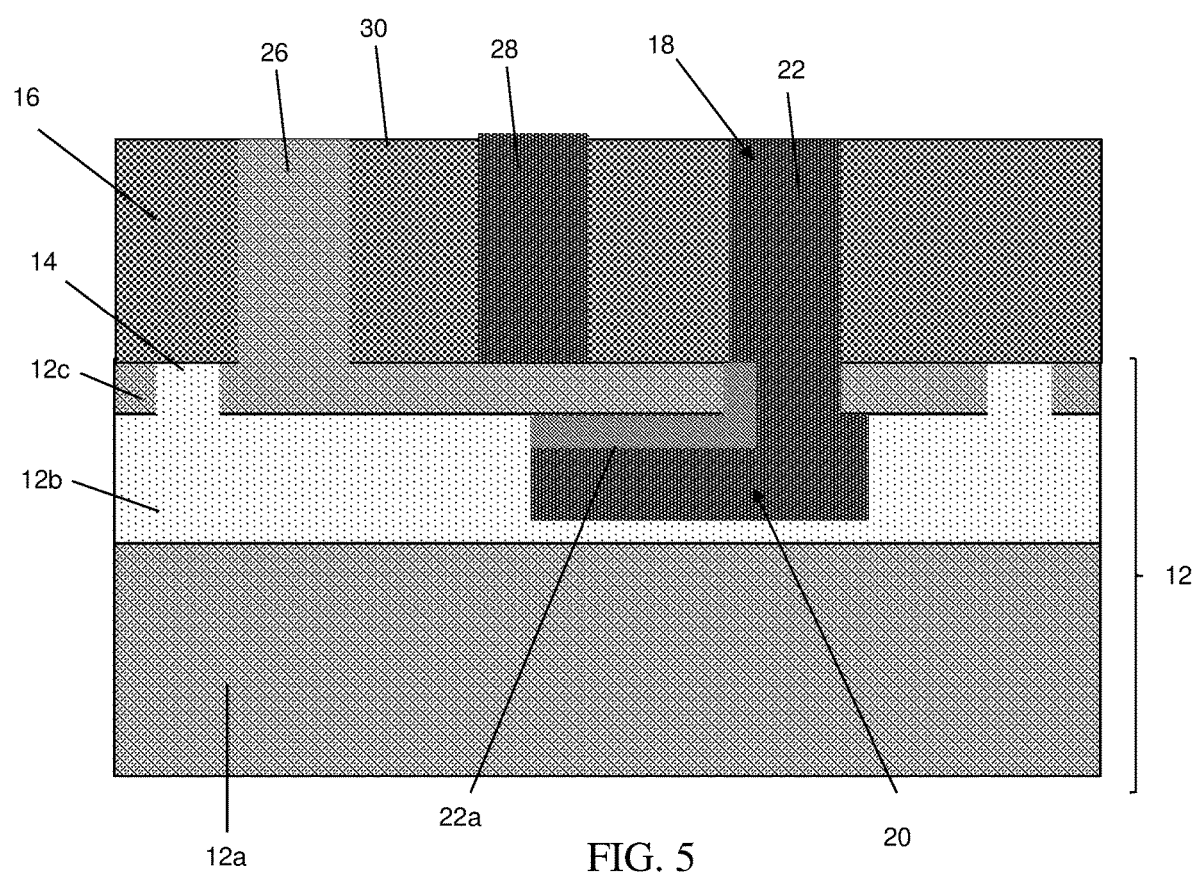
FIG. 5 shows an emitter region, amongst other features, and respective fabrication processes in accordance with aspects of the present disclosure.

Referring to FIGS. 3A and 3B, semiconductor material 22, 22a may be formed within the trench 18 and the cavity 20. In embodiments, the semiconductor material 22, 22a may be SiC or Si material or a combination of two, which may be used as a buried collector region confined within the insulator layer 12b of the bipolar transistor. The semiconductor material 22, 22a that extends vertically upward from the buried portion may be utilized as a collector contact region that extends vertically through the semiconductor layer 12c and masking material 16. As shown, the collector region (e.g., semiconductor material 22, 22a) extends deeper into the buried oxide layer (e.g., insulator layer 12b) compared to the intrinsic base region (e.g., semiconductor layer 12c) or emitter region (as shown in FIG. 5).

In FIG. 3A, the semiconductor material 22, 22a may completely fill the cavity 20; whereas, in FIG. 3B, the semiconductor material 22, 22a may partially fill the cavity 20 leaving airgaps 24 at a bottom thereof (e.g., between a bottom surface of the cavity in the insulator layer 12b and the semiconductor material 22). In either scheme, the collector region (e.g., semiconductor material 22, 22a) is buried in the insulator layer 12b, underneath and in contact with the semiconductor layer 12c, e.g., intrinsic base region.

The semiconductor material 22, 22a may be epitaxially grown in the trench 18 and cavity 20, with an in-situ doping process. For example, the in-situ doping process includes an n-type dopant, e.g., arsenic, phosphorous, Sb, etc. for an NPN device. The doping process may be a gradient doping with the semiconductor material 22a having a lower concentration of dopant than the semiconductor material 22. That is, the lower concentration doped semiconductor material 22a may be provided at a junction contacting the intrinsic base region, e.g., semiconductor layer 12c. In alternative embodiments, the doping concentration of the semiconductor materials 22, 22a may be tuned to different or the same concentrations depending on the desired performance characteristics of the bipolar transistor.

For a non-selective epitaxial growth of semiconductor material 22, semiconductor material 22a touching the intrinsic base may grow as single crystal and polycrystalline semiconductor material 22 may grow from the dielectric interfaces resulting in a polycrystalline collector contact region 22 in the cavity 20. Alternatively, the entire growth may be a selective epitaxial process where both semiconductor material 22, 22a may be single crystal.

Figure 4:
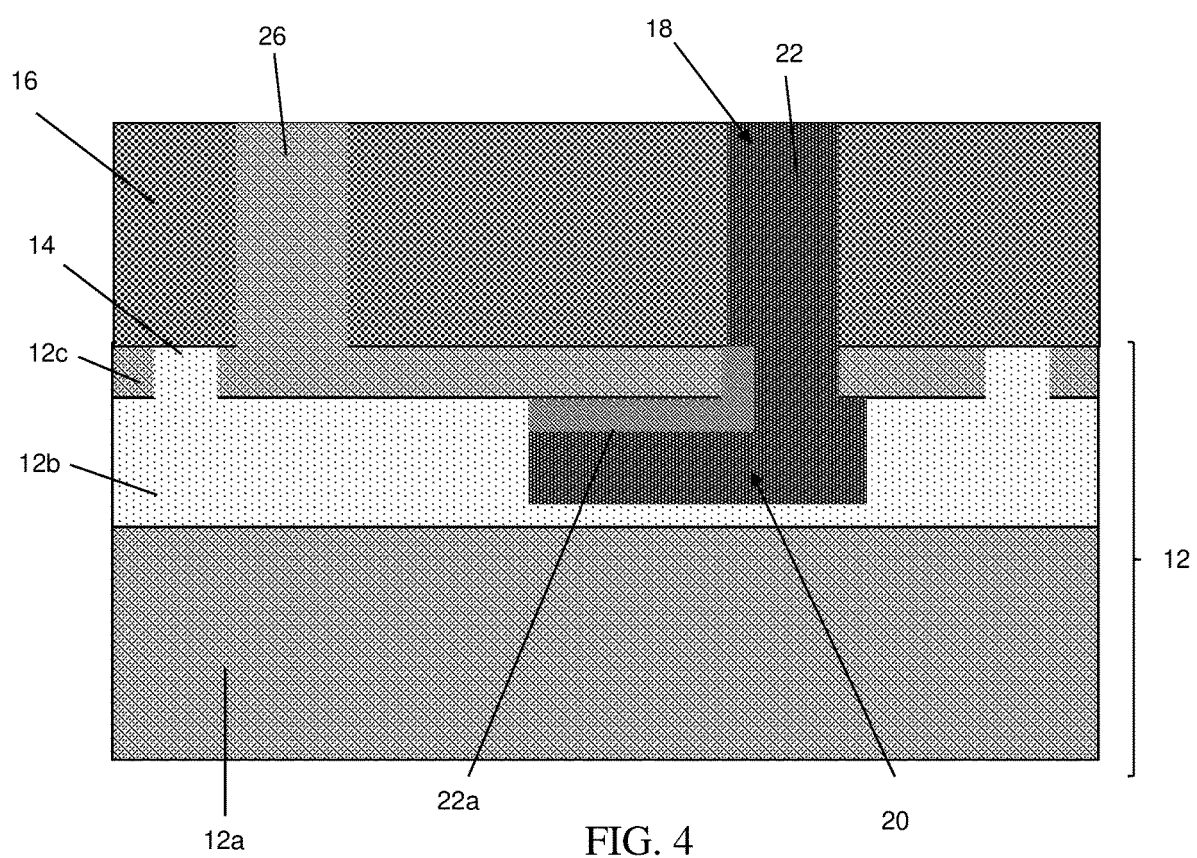
FIG. 4 shows an extrinsic base region, amongst other features, and respective fabrication processes in accordance with aspects of the present disclosure.

In FIG. 4, an extrinsic base region 26 may be formed within the masking material 16, vertically extending to and contacting the semiconductor layer 12c (e.g., lightly doped intrinsic base region). The extrinsic base region 26 may comprise a P+ doped semiconductor material. For example, the extrinsic base region 26 may comprise a heavily doped P+ Si material. In embodiments, the p-dopant may be boron. The extrinsic base region 26 may be formed by conventional lithography and etching processes which form a trench in the masking material 16, followed by an epitaxial growth process of semiconductor material with an in-situ doping process as is known in the art.

In FIG. 5, an emitter region 28 may be formed within the masking material 16, extending to and contacting the semiconductor layer 12c (e.g., intrinsic base region). The emitter region 28 may comprise N+ doped semiconductor material. For example, the emitter region 28 may comprise a heavily doped N+ Si or polysilicon material. In embodiments, the emitter region 28 may be formed by conventional lithography and etching processes which form a trench in the masking material 16, followed by an epitaxial growth process of semiconductor material with an in-situ doping process as is known in the art.

As further shown, the emitter region 28, the extrinsic base region 26 and the collector region (semiconductor material 22a, 22) may be separated or isolated from each other by the masking material 16. More specifically, the masking material 16 acts as sidewall spacers 30 laterally isolating each of the regions 22, 26, 28, without the need for any additional masking or deposition processes.

Figure 6A:
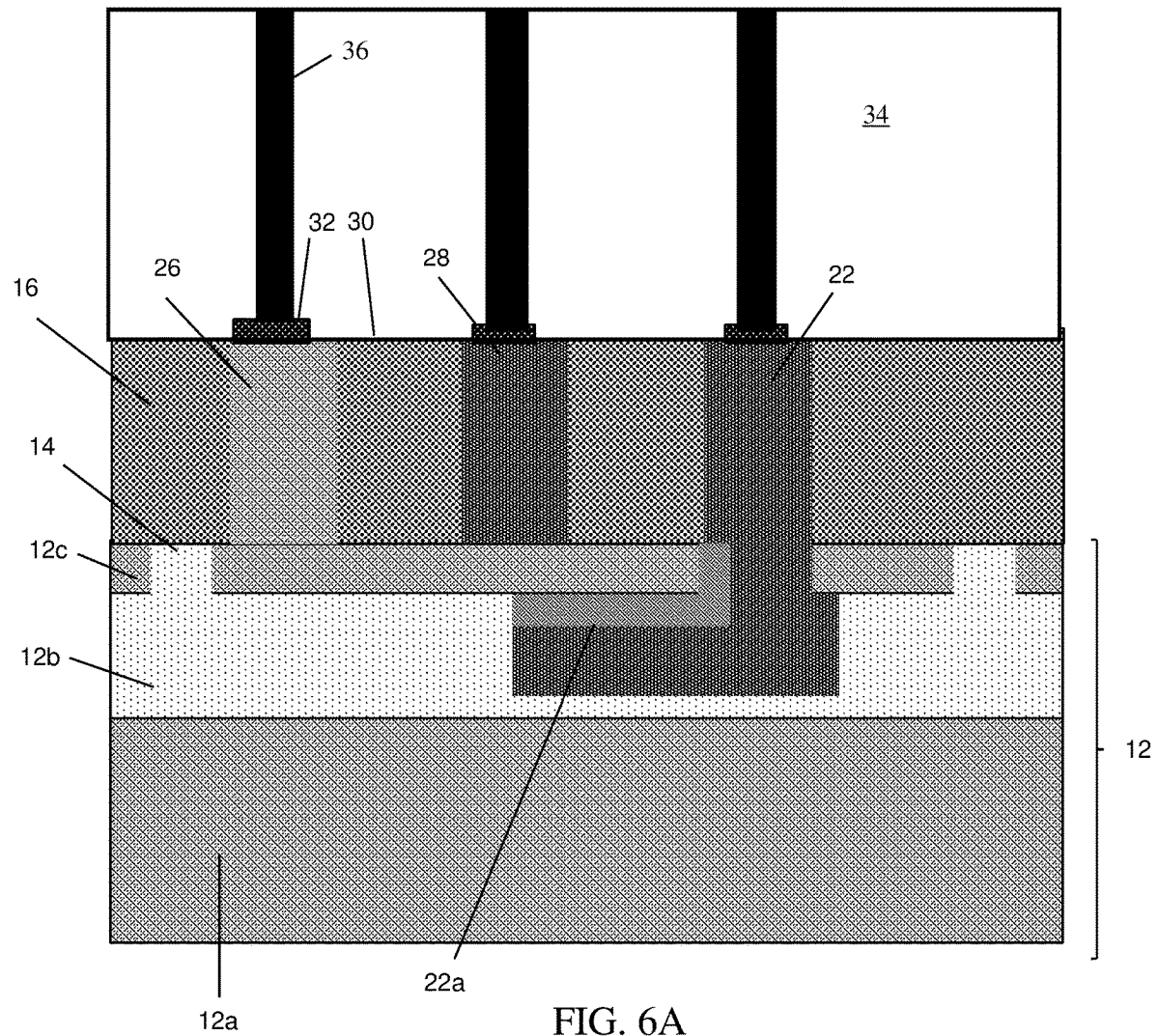
FIGS. 6A and 6B show contacts connecting to the emitter region, the extrinsic base region and the collector region, and respective fabrication processes in accordance with aspects of the present disclosure.
Figure 6B:
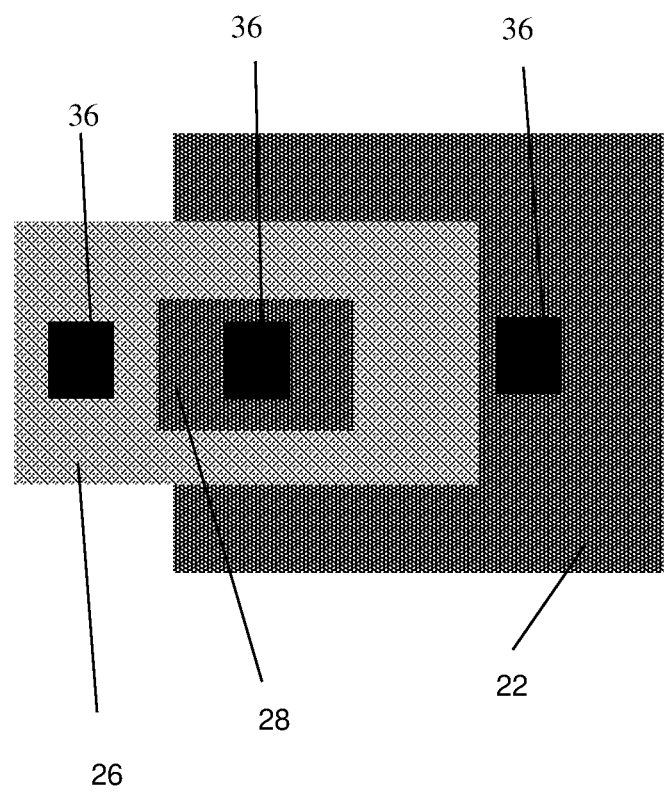

FIGS. 6A and 6B show contacts 36 connecting to the emitter region 28, the extrinsic base region 26 and the collector region (semiconductor material 22a, 22). FIG. 6A is a cross-sectional view of the device and respective contacts, whereas FIG. 6B is representative of top-down cross-sectional view of the device and the respective contacts. As shown in FIG. 6B, the emitter region 28, the extrinsic base region 26 and the collector region (semiconductor material 22) overlap with one another.

Prior to forming the contacts, silicide contacts 32 may be formed on the semiconductor material of the emitter region 28, the extrinsic base region 26 and the collector region (semiconductor material 22a, 22). As should be understood by those of skill in the art, the silicide process begins with deposition of a thin transition metal layer, e.g., nickel, cobalt or titanium, over fully formed and patterned semiconductor material. After deposition of the transition metal layer, the structure is heated allowing the transition metal to react with exposed semiconductor material forming a low-resistance transition metal silicide, e.g., NiSi. Following the reaction, any remaining transition metal is removed by chemical etching, leaving the silicide contacts 32 on the semiconductor material of the emitter region 28, the extrinsic base region 26 and the collector region (semiconductor material 22a, 22).

Still referring to FIGS. 6A and 6B, an interlevel dielectric material 34 may be deposited over the emitter region 28, the extrinsic base region 26 and the collector region (semiconductor material 22a, 22). In embodiments, the interlevel dielectric material 34 may be a stack of materials comprising oxide and nitride, deposited by conventional CVD processes. Vias may be formed in the interlevel dielectric material 34 using conventional lithography and etching processes to expose the silicide contacts 32 of the emitter region 28, the extrinsic base region 26 and the collector region (semiconductor material 22a, 22). The contacts 36 may be formed by depositing conductive material, e.g., tungsten, aluminum, etc., within the vias using conventional CVD processes. Any residual material on the interlevel dielectric material 34 may be removed by a CMP process. The collector region (semiconductor material 22a, 22) embedded within the insulator layer 12b preferably does not overlap with the contact to the extrinsic base region 26.

Figure 7:
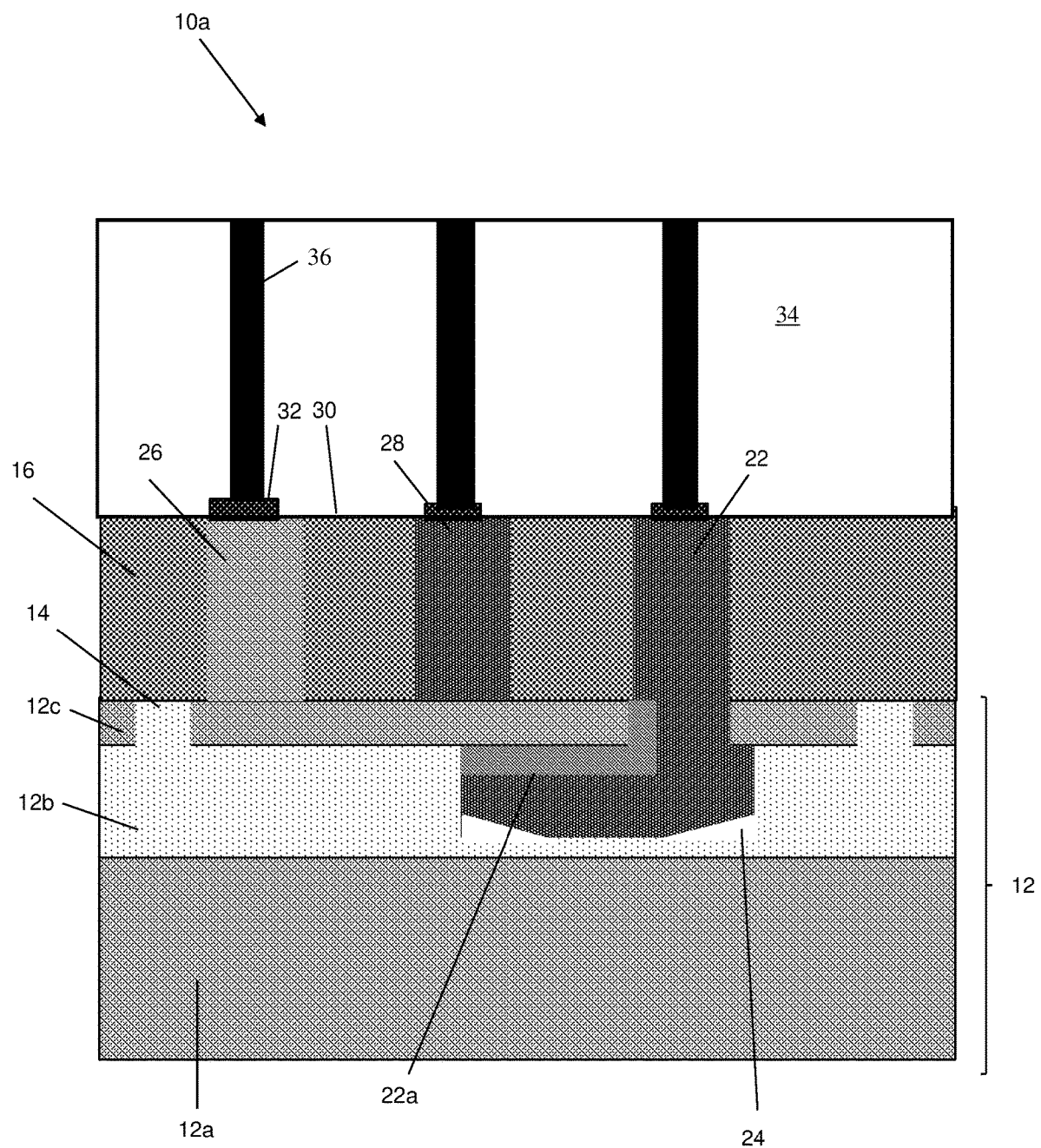
FIGS. 7-9 show alternative structures and respective fabrication processes in accordance with aspects of the present disclosure.

FIG. 7 shows an alternative structure 10a in accordance with aspects of the present disclosure. In this embodiment, the processing steps shown FIGS. 4-6 start from the structure shown in FIG. 3B with the airgaps 24. In accordance with these fabrication processes, the structure 10a includes the airgaps 24 under the collector region buried in the insulator layer 12b. The remaining features of the structure 10a are similar to that described with respect to FIG. 6.

Figure 8:
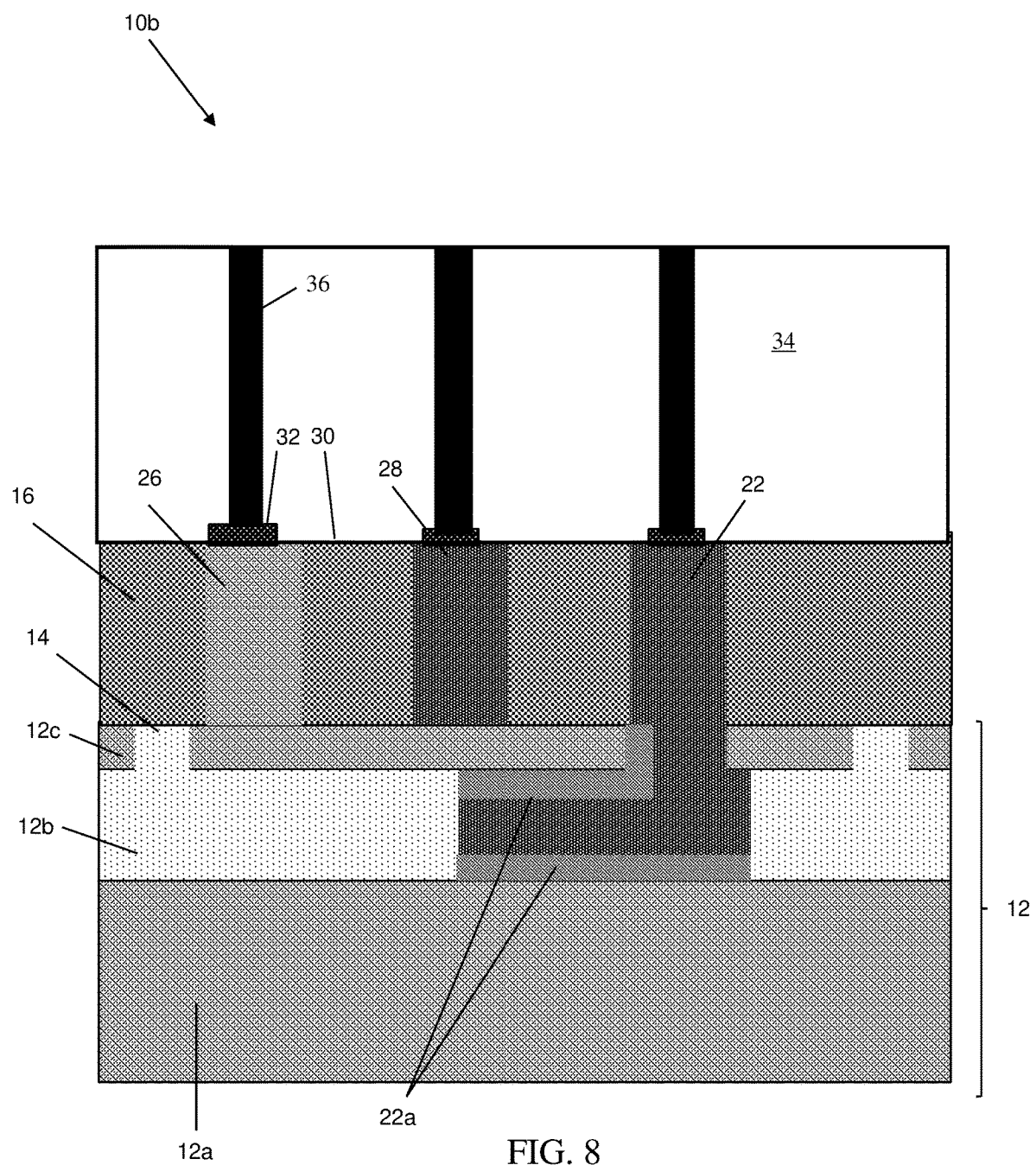

FIG. 8 shows another structure 10b in accordance with aspects of the present disclosure. In this embodiment, the collector region (semiconductor material 22a, 22) buried in the insulator layer 12b reaches to and contacts the underlying semiconductor handle wafer 12a. More specifically, in the fabrication processing of this embodiment, the cavity 20 is etched to extend to and expose the underlying semiconductor handle wafer 12a. The collector region comprises the lower doped concentration of semiconductor material 22a contacting the semiconductor handle wafer 12a and the semiconductor layer 12c. This may be due to the semiconductor material growing in two directions: top down starting from the semiconductor layer 12c and bottom up starting from the exposed semiconductor handle wafer 12a. It should also be understood that the doping concentration of the semiconductor materials 22, 22a may be tuned to different or the same concentrations depending on the desired performance characteristics of the bipolar transistor. The remaining features of the structure 10b are similar to that described with respect to FIG. 6.

Figure 9:
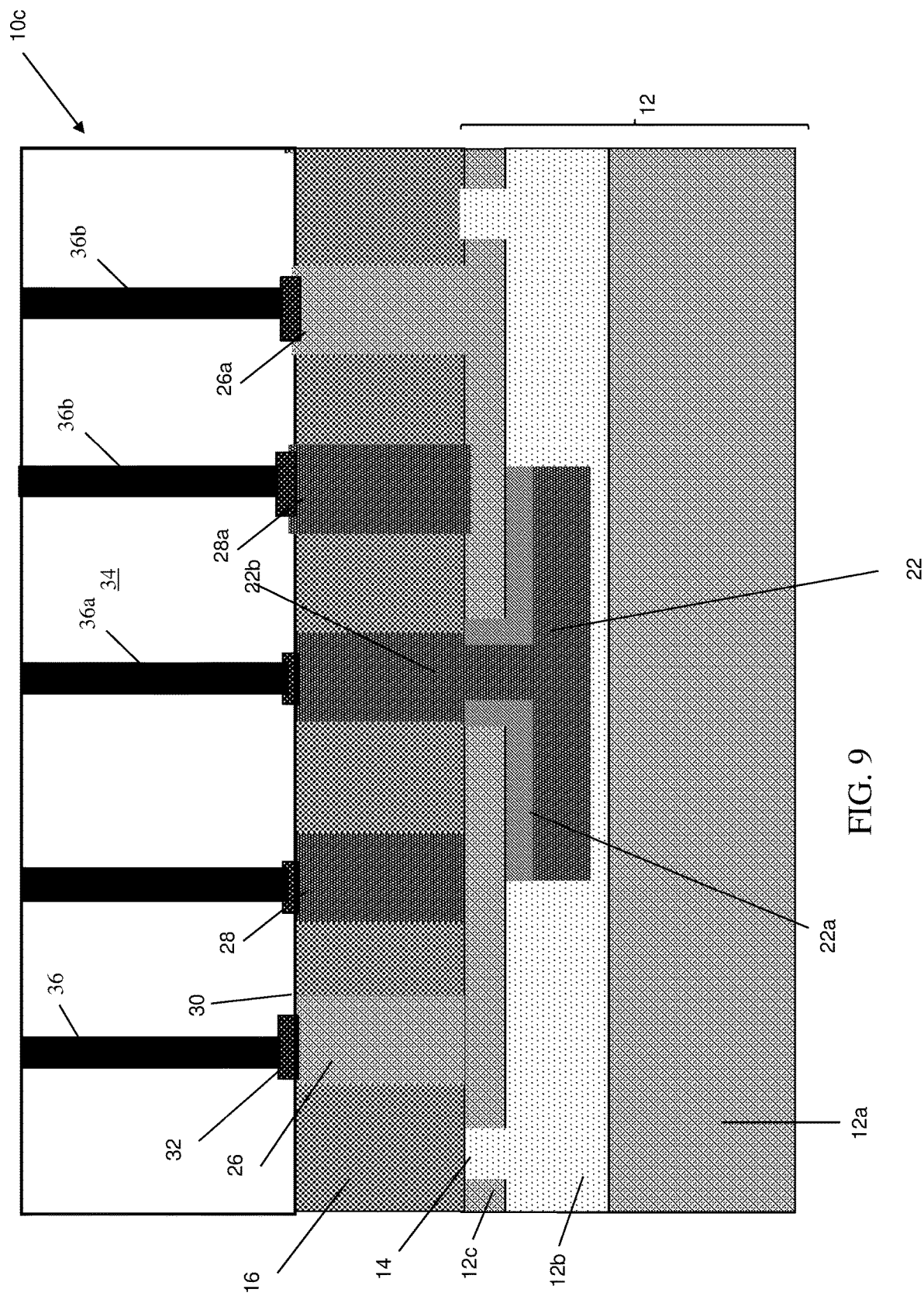

FIG. 9 shows yet another structure 10c in accordance with aspects of the present disclosure. In this embodiment, the collector region (semiconductor material 22a, 22) buried in the insulator layer 12b is symmetrical about the vertical portion 22b, e.g., collector contact 36a. In addition, an emitter region 28a and extrinsic base region 26a each have their own contacts 36b, which are on one side of the collector contact 36a with the contacts 36 for the emitter region 28 and extrinsic base region 26 being on another side of the collector contact 36a. In this way, the emitter regions 28, 28a and extrinsic base regions 26, 26a are symmetrically positioned about the collector region (semiconductor material 22a, 22), e.g., the collector contact 36a.

More specifically, in the fabrication processing of this embodiment, the cavity 20 is etched within the insulator layer 12b equally on both sides of a trench, and then filled with the semiconductor material 22a, 22. As in the other embodiments, the collector region comprises the lower doped concentration of semiconductor material 22a which contacts the semiconductor layer 12c and the higher doped concentration of the semiconductor material 22 within the cavity, itself. In addition, two emitter regions 28, 28a are formed together and the two extrinsic base regions 26, 26a are formed together, in processes already described herein. The remaining features of the structure 10b are similar to that described with respect to FIG. 6.

The vertical transistors can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multichip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
    an intrinsic base region comprising semiconductor-on-insulator material;
    a collector region confined within an insulator layer beneath the semiconductor-on-insulator material;
    an emitter region above the intrinsic base region;
    an extrinsic base region above the intrinsic base region; and
    sidewall spacers separating the extrinsic base region from the emitter region, and a collector contact region extending vertically upwards from the collector region.

2. The structure of claim 1, wherein the collector region is confined within a cavity of a buried oxide material underneath the semiconductor-on-insulator material.

3. The structure of claim 1, wherein the semiconductor-on-insulator material comprises P-doped Si material.

4. The structure of claim 1, wherein the semiconductor-on-insulator material comprises P-doped SiGe material.

5. The structure of claim 1, wherein the collector region comprises N-doped semiconductor material with a gradient concentration.

6. The structure of claim 1, wherein the collector region is symmetrical.

7. The structure of claim 1, wherein the collector region extends to and contacts an underlying semiconductor handle substrate, and shallow trench isolation structures extend in a semiconductor material below the insulator layer.

8. The structure of claim 7, wherein the collector region comprises N-doped semiconductor material with a gradient concentration, with a lower concentration at regions contacting the semiconductor-on-insulator material and the underlying semiconductor handle substrate.

9. The structure of claim 1, wherein the sidewall spacers comprise a single masking material.

10. The structure of claim 1, wherein the collector region does not overlap with a base contact.

11. A structure comprising:
    an intrinsic base region comprising semiconductor-on-insulator material;
    a collector region confined within an insulator layer beneath the semiconductor-on-insulator material;
    an emitter region above the intrinsic base region;
    an extrinsic base region above the intrinsic base region; and
    an airgap under semiconductor material of the collector region and above a bottom surface of the insulator layer.

12. A structure comprising:
    an intrinsic base region comprising doped semiconductor material;
    an emitter region extending vertically upward from the intrinsic base region;
    an extrinsic base region extending vertically upward from the intrinsic base region;
    a collector contact extending vertically upward from the intrinsic base region; and
    a collector region within a cavity in insulator material beneath the doped semiconductor material and contacting the intrinsic base region and the collector contact,
    wherein the doped semiconductor material comprises semiconductor-on-insulator material and the insulator material comprises buried oxide material.

13. The structure of claim 12, wherein the collector region comprises semiconductor material with a dopant gradient concentration lower at a junction of the intrinsic base region than remaining regions of the collector region.

14. The structure of claim 12, wherein the collector region extends to and contacts an underlying semiconductor material and a dopant gradient concentration lower at a junction of the intrinsic base region and the underlying semiconductor material than remaining regions of the collector region.

15. The structure of claim 12, further comprising an airgap under the collector region.

16. The structure of claim 12, wherein the collector region does not overlap with a base contact.

17. A structure comprising:
    an intrinsic base region comprising doped semiconductor material;
    an emitter region extending vertically upward from the intrinsic base region;
    an extrinsic base region extending vertically upward from the intrinsic base region;
    a collector contact extending vertically upward from the intrinsic base region; and
    a collector region within a cavity in insulator material beneath the doped semiconductor material and contacting the intrinsic base region and the collector contact; and
    a masking material that isolates the emitter region from the extrinsic base region and the collector contact.

18. A method comprising:
    forming an intrinsic base region comprising semiconductor-on-insulator material;
    forming a collector region confined within an insulator layer beneath the semiconductor-on-insulator material;
    forming an emitter region above the intrinsic base region; and
    forming an extrinsic base region above the intrinsic base region; and
    forming an airgap under semiconductor material of the collector region and above a bottom surface of the insulator layer.

* * * * *